United States Patent [19]

Fraser

[11] Patent Number: 4,789,987
[45] Date of Patent: Dec. 6, 1988

[54] AUTOMATIC MODULATION CONTROL APPARATUS

[75] Inventor: George D. Fraser, Richardson, Tex.

[73] Assignee: Rockwell International Corporation, El Segundo, Calif.

[21] Appl. No.: 68,981

[22] Filed: Jul. 1, 1987

[51] Int. Cl.⁴ .............................................. H01S 3/13
[52] U.S. Cl. ....................................... 372/31; 372/38
[58] Field of Search .................. 455/618; 372/38, 33, 372/34, 26, 28, 29, 31, 32

[56] References Cited

U.S. PATENT DOCUMENTS 4,369,525  1/1983  Breton et al. ...................... 455/618

OTHER PUBLICATIONS

Electronics Letters, Nov. 23rd 1978, vol. 14, No. 24 p. 775 by D. W. Smith.
IEEE 13th Inter. Conference on Circuits and Systems, 1980 p. 926, D. W. Smith et al. "Laser Level Control for High Bit etc.".

Primary Examiner—William L. Sikes
Assistant Examiner—B. Randolph
Attorney, Agent, or Firm—Bruce C. Lutz; V. Lawrence Sewell; H. Fredrick Hamann

[57] ABSTRACT

A circuit used in conjunction with RF modulating a laser diode and controlling the bias point is presented. The novel function is the amplitude and level shifting modulation of the drive signal at two different low (non-RF) frequencies. The light output is then detected to ascertain the relative amounts of the two different frequencies. The amplitude modulated signal appearing in the light output rises as there is increased distortion due to clipping on the threshold side or knee of the light current curve of the diode, and the amount of the level shifting modulation frequency signal drops with increased amounts of clipping. The two signals are used to derive a feedback signal to control the amplitude of the drive signal to maintain the relative detected amounts of the two signals appearing in the light output at a given ratio.

5 Claims, 4 Drawing Sheets

AUTOMATIC MODULATION CONTROL APPARATUS

THE INVENTION

The present invention is generally related to electronics and more specifically related to laser diode optical signal generation, and even more specifically, to a control mechanism for automatically adjusting the amplitude of the drive signal applied to a laser thereby providing an optimum light output over aging and temperature variations of the diode.

BACKGROUND

The need to optimize the DC bias point and the amplitude of the drive signal has been recognized in various prior art articles, such as that illustrated and described in *Electronics Letters,* 23rd Nov., 1978, Volume 14, No. 24, on Page 775, by D. W. Smith, and a later article in the *IEEE* 13th *International Conference on Circuits and Systems* in 1980 entitled, "Laser Level Control For High Bit Rate Optical Fiber Systems" by D. W. Smith and T. G. Hodgkinson on Page 926. However, these prior art approaches could only maintain the drive signal in accordance with an initial setting or condition of the laser diode. In other words, as the laser changed its threshold knee, and/or slope of the light vs. current characteristic due to age, temperature and other factors, the referenced control systems would no longer provide optimum output information. As is known to those skilled in the art, the knee is the threshold of current through the diode at which the light output is uniform in frequency or in other words, the diode is in the laser mode.

As is known to those skilled in the art, and as brought out in these referenced articles where the data being optically output has a high bit rate, it is desirable that the logic zero portion of data bits drive the laser diode current to a value that is very close to the threshold point or knee of the LI curve of the diode. Thus, when a given drive signal and a given bias is applied to a diode and its characteristics change, the drive will normally extend considerably below the knee of the diode since, typically, with aging and higher temperatures, the knee of the curve occurs at greater currents and the slope changes such that much greater currents are required to provide the maximum light output. Since it is undesirable to overdrive the diode whereby the life is substantially shortened, the average power output needs to be controlled at the same time as the drive signal is controlled.

SUMMARY OF THE INVENTION

The present invention accomplishes the two control functions simultaneously with the automatic bias control being accomplished in a manner similar to that of the prior art, and somewhat similar to that described in the references, but the control of the drive signal amplitude permits the drive signal to change amplitude in accordance with conditions so as to maintain the logic zero portion of the signal substantially at the knee of the diode LI curve.

The above is accomplished by amplitude modulating the data drive signal with a first low frequency signal, and level shift modulating the drive signal with a second low frequency signal. This double modulated signal is used to drive the laser diode and the light output of the diode is then detected. The detected amplitude modulated signal appearing in the light output rises as the drive signal becomes larger whereby the logic zero level passes into the threshold or knee of the diode while the detected level shifting modulation signal drops as the drive signal increases to a value where it falls into the logic zero threshold or knee of the diode. Drive circuitry can compare these two values and adjust the drive amplitude to a value such that the two detected values maintain a given appropriate relationship. Typically, this appropriate relationship would have equal amplitudes but by scaling factors, could be any two values. Simultaneously, the average power output of the laser is detected to maintain the bias at a given desirable value in a manner somewhat similar to that of the prior art.

It is thus an object of the present invention to provide an improved control circuit for modulation control of a laser diode light generating circuit.

Other objects and advantages of the present invention will be apparent fror a reading of the specification and appended claims in conjunction with the drawings wherein:

DETAILED DESCRIPTION

Figure 1:
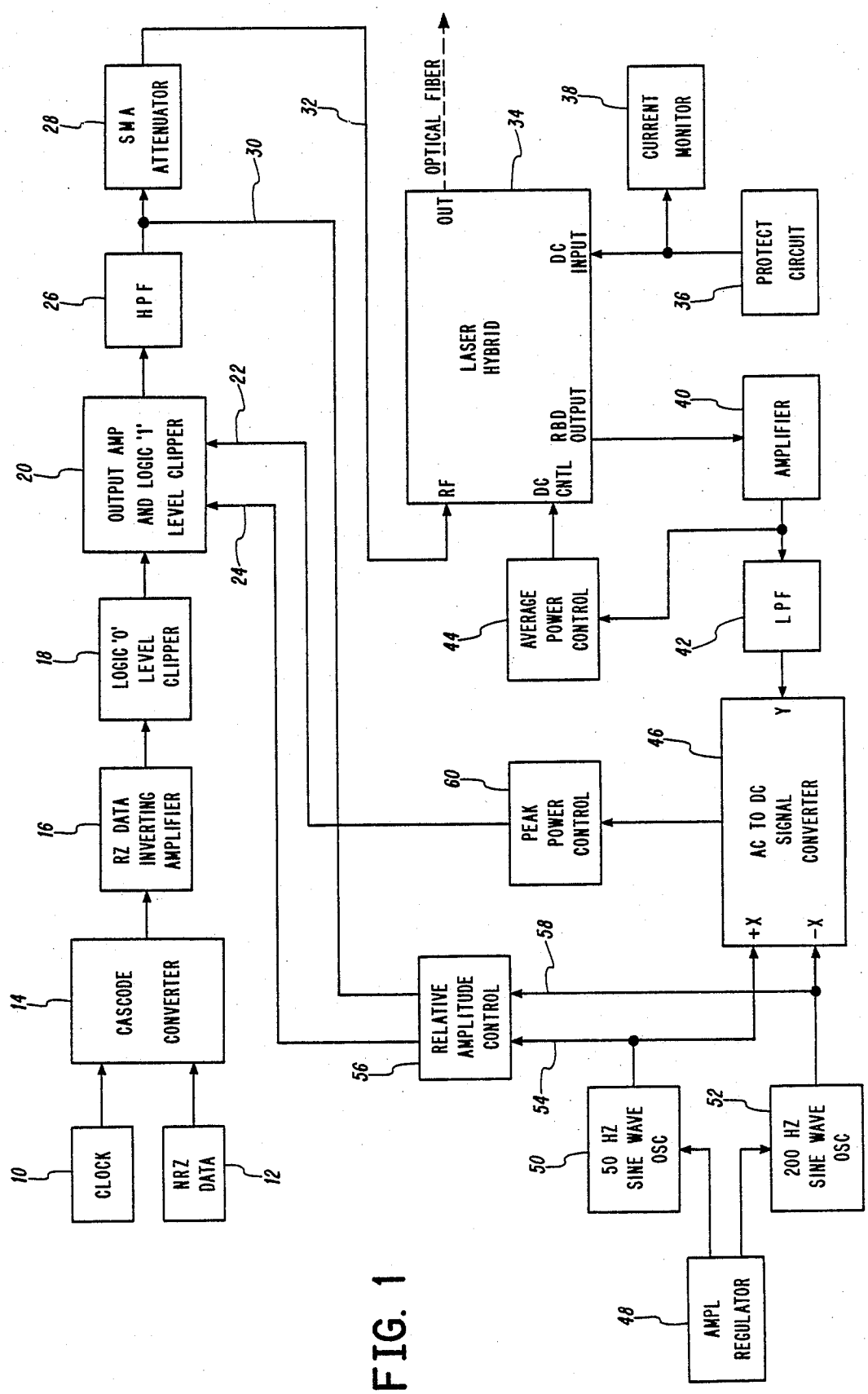
FIG. 1 is a block diagram of the inventive concept as applied to an actual embodiment in a device.

In FIG. 1, a clock 10 and a nonreturn-to-zero data source 12 supply signals to a Cascode converter 14, which at the times of the clock 10 change the non-return-to-zero signal to a return-to-zero signal. The signal from block 14 is passed to 16 which inverts the data and then it is passed to a block 18 which provides a logic zero level clipper. The output of clipper 18 is supplied to an amplifier block 20, which has an amplitude control input on lead 22 and a 50 Hz signal on a lead 24. An output of block 20 is supplied to a high pass filter 26 which supplies signals to an attenuator block 28 and filter 26 effects AM modulation. A lead 30 introduces 200 Hz signals into the signal path to attenuator 28 to effect a level shift modulation of the sgnal output by filter 26. Filter 26 is used in conjunction with block 20 to produce 50 Hz AM modulation. Filter 26 has no effect on level shifting. An output of block 28 supplies an RF modulation input on a lead 32 to a laser hybrid block 34. A laser protection circuit 36 supplies signals both to a laser current monitor 38 and to a laser DC input of block 34. An output of block 34 from a rear beam detector which detects the laser or optical output of block 34 for feedback purposes is supplied to an amplifier 40 which supplies signals both to a low-pass filter 42 and to an average DC power control block 44 which returns laser DC control input signals to block 34. An output of filter 42 supplies signals to a differential input multiplier and signal detector block 46. An amplitude regulator block 48 supplies amplitude regulating signals to a pair of oscillators 50 and 52 which supply 50 and 200 Hz signals, respectively. Oscillator block 50 supplies the signals on a lead 54 to a relative amplitude control block 56 and to a positive input of block 46. The oscillator 52 supplies signals on a lead 58 to the same two blocks. The detector 46 sums the signals from oscillators 50 and 52 and multiplies this sum by the signal from filter 42. Detector 46 provides an output to a peak power control block 60 which supplies a control signal on lead 22 to the block 20. The leads 24 and 30 are the outputs from block 56.

Figure 2:
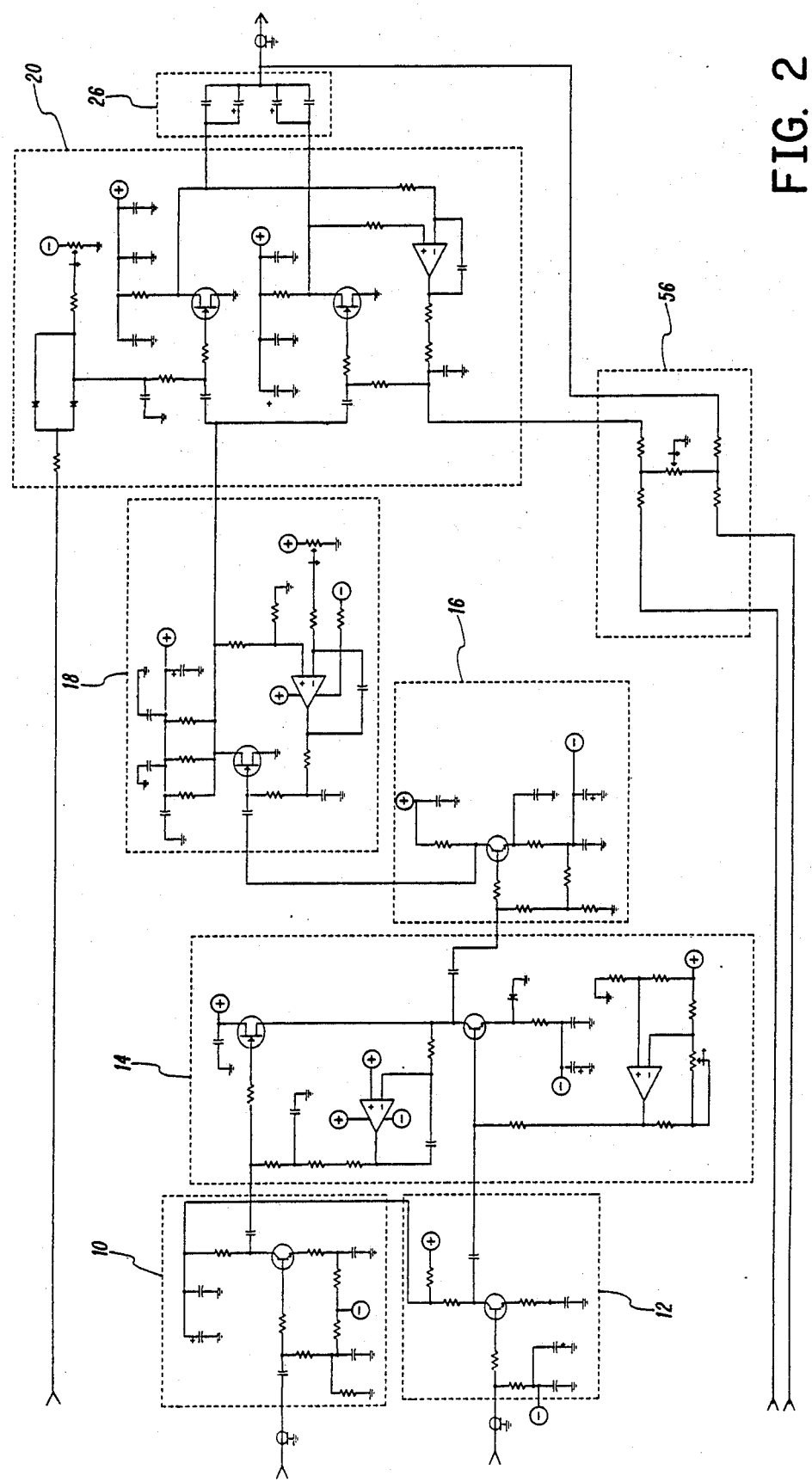
FIG. 2 is a schematic diagram of a portion of FIG. 1.
Figure 3:
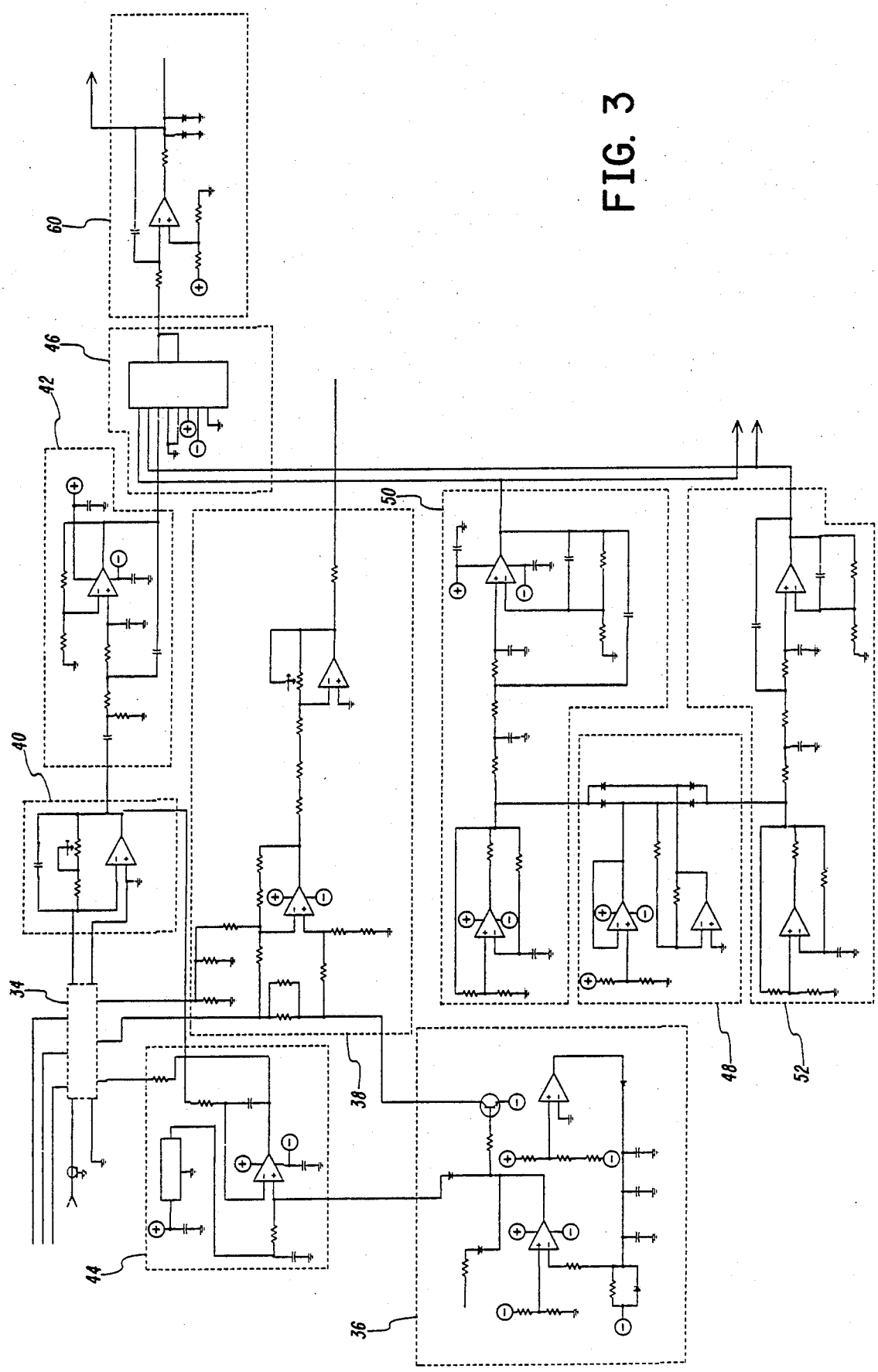
FIG. 3 is a schematic diagram of the remaining blocks of FIG. 1.

FIGS. 2 and 3 have designations as to the dash line boxes which are identical to that in FIG. 1, and merely illustrate circuitry used in one implementation of the present invention. None of the circuitry is considered to be novel in and of itself and no further explanation will be given of the specific circuitry, as it is believed reasonably obvious from the explanation of the operation of the blocks as to how the circuitry within these blocks works. The integrated circuit within block 46 is a differential multiplier which may be purchased under Part No. AD532 from Analog Devices.

Figure 4:
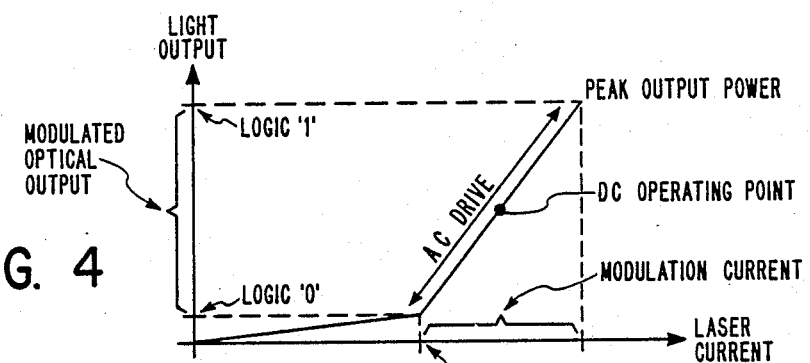
FIG. 4 is a graph used in explaining the characteristics of a laser diode.

In FIG. 4, a graph is shown with the vertical axis being the light output from a laser diode, and the horizontal axis being representative of the laser current required to provide the given light output. The curve on this graph has a knee which is illustrated at the point labeled THRESHOLD. The threshold is the current level at which the laser diode begins to behave as a laser. For communication purposes, the modulation must start at the threshold and extend up to the peak power output point. When the laser is modulated from the threshold to some peak value, the optical output spectrum of the laser is substantially a single frequency. If, however, the alternating amplitude drive is adjusted so that the logic zero current falls slightly below the threshold or knee, the optical output spectrum of the laser will broaden on a static and dynamic basis. This will lead to communication errors due to the dispersion of signals within the optical fiber. Since the data has a mark-space ratio of one to one, there is no necessary control over the peak power output, but it is desirable to have the DC operating point at a value such that the average power out from the laser diode stays within prescribed limits for optimum operating life of the laser diode. In other words, if it is operated at too high an average power level, the life of the diode will be detrimentally and seriously affected. Thus, this graph shows a DC operating point and a drive swing of the signal to change the laser output from the light available at the threshold to the illustrated peak power output.

Figure 5:
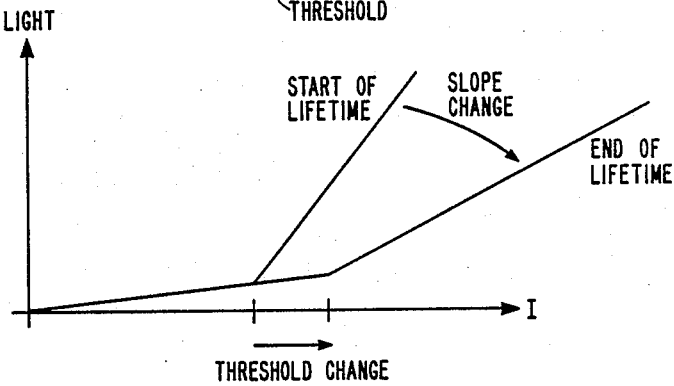
FIG. 5 is a second graph for use in explaining the change of characteristics over the lifetime of a laser diode.

FIG. 5 illustrates a further graph also having light as the vertical axis and current as the horizontal axis, and shows a typical diode characteristic at the start of lifetime operation and how both the slope and the knee values change over the period of the life of the diode. Somewhat similar changes can also be effected by temperature and other environmental factors.

Figure 6:
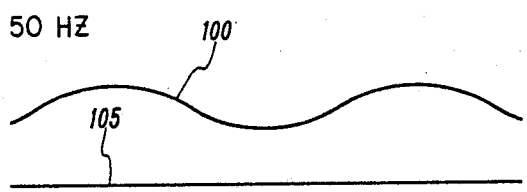
FIGS. 6 and 7 illustrate the waveform of the data drive signal and the effective light output from the laser diode due to the clipping effects when operating at an appropriate feedback stabilized set of conditions.

In FIG. 6, an upper curve is designated as 100 while a lower curve of the amplitude modulated data wave is 102 and a dash line 104 represents the threshold or knee of the diode. A line 105 represents both a reference potential and the average value of the envelope lines 100 and 102.

Figure 7:
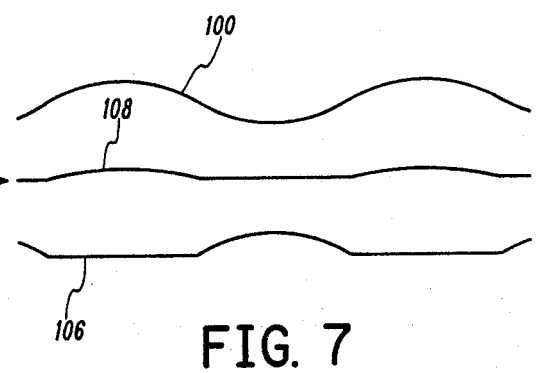

FIG. 7 has the same designation as FIG. 6 for the upper portion of the amplitude modulated signal, and a curve represented as 106 to represent the light output obtained from the conditions of FIG. 6. A further signal 108 is designated intermediate the curves 100 and 106 to show the average value of the data as compared to a ground reference potential over the period of time represented by FIG. 7.

Figure 8:
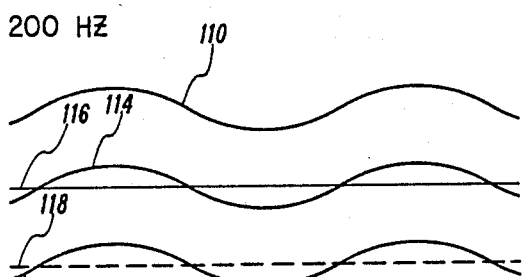
FIGS. 8 and 9 represent level shifted versions of the data drive signal and are used for explaining the signal detection of this modulation component from the main output light signal.
Figure 9:
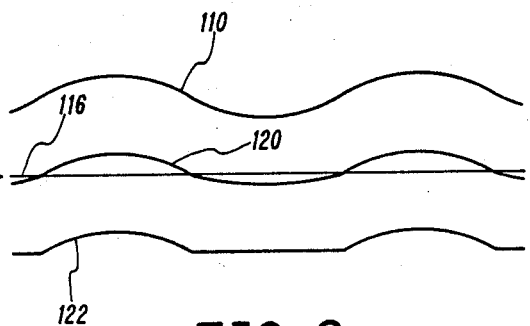

FIG. 8 represents a data wave which is modulated only by a level shifted signal, as opposed to the amplitude modulation of FIGS. 6 and 7, purely for the purposes of explanation since, although the two are combined in an actual circuit, the combining of the two in an operations discussion would unnecessarily confuse the discussion. In FIG. 8, the upper portion of the waveform is designated 110, while the lower portion is 112, the average value 114, the DC value 116 and the knee of the diode 118. In FIG. 9, the upper value of the waveform is again designated as 110, the reference as 116, with the new average value being 120, which occurs as a result of the new lower waveform due to the limiting of the threshold on the output light signal and designated as 122.

OPERATION

Semiconductor lasers used for optical fiber communication have a current versus light output characteristic, essentially as shown in FIG. 4. The threshold or diode knee is the current level at which the device begins to behave as a laser. In other words, below the threshold, the optical output spectrum of the light is broader than that defined as a laser and will cause dispersion of the light in an optical fiber. Above the threshold, the semiconductor device produces a single frequency light output. For communications purposes, the modulation most desirable starts at the threshold and extends up to the peak power point.

If the laser is modulated from below the threshold to somewhere in the vicinity of the peak power point, the optical output spectrum of the laser will broaden on a static and dynamic basis. This will lead to communication errors due to the dispersion of the optical fiber, as referenced above.

On the other hand, if the laser is driven from above the threshold to the vicinity of the peak output power point, a sensitivity penalty is incurred at the receiver due to the reduced resolution between the logic "0" and logic "1" values of the received signal.

The laser diode is driven with both a DC and an AC current. The DC current drives the laser to a median point on the operating range such as shown in FIG. 4 as DC operating point. The AC signal drives the diode above and below this point and, in optimal operation, will drive it from the threshold to the peak output power designated in FIG. 4.

In the present invention, the DC operating point correspods to the time averaged optical power output, as determined through the use of a rear beam detector, amplifier 40 and average power control block 44 in FIG. 1.

The actual value of the threshold current and the slope of the operating region are subject to variation with temperature and aging, as illustrated in FIG. 5. For this reason, the DC and AC currents must be controlled in a manner to maintain the laser at the proper DC operating point with an AC signal of sufficient amplitude to provide optimum output logic "1's" and logic "0's". The DC current is controlled by checking the average output power in a manner similar to that of the prior art referenced previously. The present system compensates for the laser slope change and may be termed "slope control", as opposed to prior art "threshold control", which prior art systems compensated only for average power output changes.

When the laser is in an operating condition it produces both a front and a rear beam. The front beam is coupled to the fiber and the optical output of the laser may be detected by a known technique of using a photodiode to detect the optical output from the rear. This is commonly designated as a rear beam detector. The photodiode produces a current in proportion to the light striking it.

In prior art laser controls, as well as in the present invention, the average rear beam detector current is compared to a reference, and the DC current through the laser is controlled to maintain an average optical output.

Determining the required level of AC modulation is difficult, because the rear beam detector cannot distinguish between light above or below threshold, and because the modulated data rate is typically much faster than the response speed of the rear beam detector. The present invention ascertains the threshold by using low speed signals which are combined with the modulating data and are detected by the rear beam detector. As the laser is driven into the threshold area, the detected amplitude of these signals is altered so that the actual location of the threshold can be determined, and the magnitude of the AC modulating signal can be controlled accordingly. As disclosed, the two control modulation signals are combined with the data using different approaches, and the relative amplitude between the two signals as detected is used to determine the threshold level. In one embodiment of the invention, two signals of 50 and 200 Hz are used, although the exact frequencies are not important. The prime item of importance is that the rear beam detector be of sufficient frequency detection capability to detect both of these signals in a known and consistent manner. As illustrated in FIG. 6 the 50 Hz signal is used to amplitude modulate the data and, as illustrated in FIG. 8, the 200 Hz signal is used to level shift the data. As further shown by the line 105 through the center of FIG. 6 representing the average value, there is no component of the 50 Hz signal detectable by the rear beam detector. On the other hand, the average value of the signal as modulated by the 200 Hz signal varies above and below ground. Since ground or reference is shown by line 116 in FIG. 8 and the average value is shown by 114, it will be apparent that there is a 200 Hz component that would be detectable by the rear beam detector. The above statements with respect to the average value are made on the assumption that the AC drive does not reach the threshold level presented as 104 in FIG. 6 or 118 in FIG. 8.

However, if the drive signal is increased in amplitude so that the modulating of the data by these two low frequency signals extends the AC signal whereby the logic 0 level on occasion exceeds the threshold, as shown in FIGS. 6 and 8, the light output result will be as shown in FIGS. 7 and 9. It will be apparent from an observation of FIGS. 7 and 9 that there is now a 50 Hz component, since the average value of the signal in FIG. 7 is no longer the same as the reference potential. On the other hand, the amplitude of the 200 Hz signal is lessened by the divide threshold level.

It must be realized that the two modulating situations are concurrent, but have been illustrated separately since it is difficult enough to illustrate with separate waveforms, and would be substantially impossible to illustrate if combined. In any event, it will be apparent that the amount of 50 Hz signal detected is proportional to how far the laser is driven into the threshold area for the logic "0" signals and is zero amplitude when the driving signal is not driven into threshold.

On the other hand, the 200 Hz modulation provides a maximum output when the driving signal for logic "0" condition does not reach the threshold at any time. However, the detected 200 Hz signal is decreased as the logic 0 level extends to and goes past the threshold value. Although it depends on the width of the logic "1" pulses, the 200 Hz signal as detected may decrease to less than half of the value detected when the AC signal does not drive to the threshold level.

The technique of using the amplitude modulation and the level shifting solves detection problems typically arising in trying to obtain information from high speed data signals. In other words, trying to modulate a logic "1" or a logic "0" level becomes very difficult as the data rate is increased. The present technique of detection provides a given polarity output from the 50 Hz detector and an opposite polarity output from the 200 Hz detector. As shown in the present embodiment, the 50 Hz detector provides a positive output, while the 200 Hz detector provides a negative output. As the laser is driven from above to below threshold, the output of the combined detector outputs changes from negative to positive. The actual operating point is set at a level where the detector output is zero and the relative levels of the 50 and 200 Hz combined with the data is adjusted initially to ensure proper threshold level at this point. Since the system operates with the detector output being zero, the absolute amplitudes of the 50 and 200 Hz signals in relation to the data or system levels is unimportant. Only the relative amplitudes of the 50 and 200 Hz signals is used in the detection system. As will be noted, the two modulating signals of 50 and 200 Hz travel together through substantially the same signal path, and any variations in level or gain in that path does not affect the operation of the system.

As indicated previously, the rear beam detector as used in this invention needs only be fast enough to respond to the signals used to amplitude and level shift modulate the data signal. This response frequency can be orders of magnitude lower than the data. One embodiment of the present invention has the data operating at a 565 MHz rate versus the 200 Hz maximum signal frequency response necessary for the rear beam detector. Since the system responds only to the change in the current versus light slope which occurs at threshold, the level of the light emitted below threshold is unimportant. The amplitude of the amplitude modulating and level shifting signals can be much smaller than the data (in the order of 1%) whereby there is no interference with the data.

Taking the above operation description into account, it will be noted that clock and data signals are received and amplified by blocks 10 and 12, respectively, and combined in block 14 to generate a return-to-zero type data from the received nonreturn-to-zero data. Block 16 inverts and amplifies the return-to-zero signal, while block 18 removes the variation on the logic zero level so that the laser threshold point is well defined. Block 20 amplifies the signal received from block 18, and controls the amplitude by clipping the logic "1" level portion of the received signal. The 50 Hz signal is received from block 56 at this point, and is combined with the data, whereby it modulates the logic "0" level and thus the rising and falling edges of the logic level signals. The signal is then passed through the high pass filter 26, which in one embodiment of the invention has a corner frequency of about 700 Hz. This blocks the 50 Hz component, but allows the data to pass, and converts the output waveform from the one sided 50 Hz modulation to amplitude modulation with no frequency component at 50 Hz. The 200 Hz signal is summed with the data via lead 30 after the high pass filter 26. The block 28 sets the initial drive amplitude to the laser hybrid block 34, so that the range of the control by block 20 does not have to cover such a wide range. The laser hybrid 34 converts the drive voltage received from block 28 into optical pulses and provides the rear beam detector output to block 40. Block 38 monitors the actual laser DC current to indicate laser aging, while block 36 protects the laser from current surges during faults and power-ups. The block 40 converts the rear beam detector current to a voltage and scales it to compensate for rear beam detector versus fiber coupling efficiency. Block 44 monitors the DC average output of block 40 to control the DC laser current and to maintain constant optical output power from the block 34. Block 42 amplifies any 50 and 200 Hz signals as obtained from block 40 and removes most of the lower speed data components which the rear beam detector is able to detect. In other words, block 42 functions as a noise filter for the 50 and 200 Hz signals with the data being the noise. Block 48 checks the amplitude of blocks 50 and 52 so that the outputs remain substantially constant over temperature with blocks 50 and 52 generating the 50 and 200 Hz signals, respectively. Block 46 is a differential input four quadrant low-speed multiplier which functions as a synchronous signal detector for the 50 and 200 Hz signals. When a sine wave is multiplied by itself, the result is a component at DC and at twice the original frequency. Thus, the multiplier 46 will produce a DC output proportional to the amplitudes of the 50 and 200 Hz signals received from block 42. Since the 50 and 200 Hz signals from blocks 50 and 52 are fed into opposite polarity inputs on the multiplier 46, the 200 Hz detected signal from block 42 drives the multiplier output negative and the 50 Hz signal drives it positive. Block 60 compares the output from block 46 with a reference of 0 volts and controls the amplitude of the data output by block 20 in accordance with the signals on lead 22 from block 60 to keep the output of block 46 at substantially zero potential. Block 56 sets the relative amplitudes of the 50 and 200 Hz signals to appropriate relative values, whereby when combined with the data they will set the proper laser operating threshold level. The automatic modulation control apparatus circuit then maintains that level even if the light versus current slope of the laser changes.

In summary, the present invention provides a low level amplitude and level shift type modulation to a drive signal for a laser diode, and detects the level shift and amplitude modulation signals as a function of the logic "0" level of the data signal passing slightly through the threshold of the diode, and uses detection circuitry to keep the relative amplitudes of these two signals at a given relative value. In this way, changing slopes and thresholds of the laser diode used to generate the optical signal is kept at a value which compensates for aging and temperature effect changes to the diode in changing the slope and threshold levels. Further, the present arrangement assures that there will be maximum sensitivity to the data at the receiving end of the optical fiber.

While I have shown a single embodiment of the inventive concept, I wish to be limited not by the embodiment shown, but only by the scope of the appended claims, wherein I claim:

1. Optical laser apparatus comprising, in combination:
    signal level clipping and modulating first means, including control input means and signal input and output means, for providing output signals adjusted in amplitude in accordance with signals supplied to said control input means thereof and amplitude modulated in accordance with a first alternating frequency signal which frequency is low compared to RF (radio frequency);
    data signal second means for supplying an RF data signal of greater than a predetermined amplitude to said signal input means of said first means;
    laser diode signal modulating third means, including RF signal input means, modulated optical signal output means and average DC current control input means, for converting signals applied to said RF signal input means to optical output signals;
    signal modifying fourth means, connected between said first and third means, for level shifting the envelope of the signal passed from said first means to said third means in accordance with a second alternating frequency signal which frequency is low compared to RF; and
    detection fifth means, connected between said third means and control input means of said first means, for detecting components of the first and second frequency signals in accordance with the amount of distortion introduced in converting from RF to optical signals and applying a control signal to said first means which varies in accordance with the relative amplitudes of the detected first and second alternating frequency signals.

2. The method of adjusting the amplitude of a laser diode data switching signal to an optimum value comprising the steps of:
    amplitude and level shift modulating a data switching signal with first and second frequency signals which signals are less than 1/100 the frequency of the data switching signal;
    modulating a laser diode with the data switching signal to produce a lightwave laser output signal;
    detecting the relative amplitude of the first and second frequency signal components in the lightwave output signal as a function of the distortion of said lightwave output signal; and
    adjusting the amplitude of the data switching signal used to modulate the laser diode to maintain a given detected relative amplitude of said first and second frequency signals.

3. Apparatus for adjusting the amplitude of a laser diode data switching signal to an optimum value comprising, in combination:
    amplitude and level shift first means modulating a data switching siganl with first and second frequency signals which are less than 1/100 the frequency of the data switching signal;

laser second means, connected to receive the modulated data switching signal from said first means, for modulating a laser diode incorporated therein with the modulated data switching signal to produce a laser output signal;

light signal detecting third means, connected to said second means, for detecting the relative amplitude of the first and second frequency signals as a function of the distortion of said laser output signal; and feedback forth means, connected between said third and first means, for adjusting the amplitude of the data switching signal used to modulate the laser diode to maintain a given detected relative amplitude of the first and second frequency signals.

4. Apparatus for automatically controlling the AC (alternating current) and DC (direct current) drive signals used in a laser diode data signal modulating device comprising, in combination:

laser diode modulation apparatus including a data signal input, an average power control input and a modulated optical signal output which is modulated between predetermined maximum and minimum light intensities;

light signal detection first means, connected to said average power control input of said laser diode modulation apparatus, for supplying thereto a feedback signal to control the DC bias level of the laser diode to maintain a given average power light output signal; and light signal detection second means, connected to said data signal input of said laser diode modulation apparatus, for supplying thereto an amplitude modulated and level shift modulated data signal whose amplitude is automatically adjusted to maintain a given amount of distortion introduced into the amplitude and level shifting modulations of the optical light output signal by the biasing of the laser diode.

5. Apparatus for automatically controlling the AC (alternating current) and DC (direct current) drive signals used in a laser diode data signal modulating device comprising, in combination:

laser diode modulation apparatus including a data signal input and a laser diode for providing a modulated optical signal output which is modulated between given maximum and minimum light intensities; and detection means, connected to said data signal input of said laser diode modulation apparatus, for detecting the optical signal output of said laser diode modulation apparatus and for supplying to the data signal input thereof an amplitude modulated and level shift modulated data signal whose amplitude is adjusted to maintain a given amount of distortion introduced into the amplitude and level shifting modulations of the optical light output signal by the biasing and signal driving of the laser diode.

* * * * *